(12) United States Patent
Kim (10) Patent No.: US 7,177,003 B2
(45) Date of Patent: Feb. 13, 2007

(54) LCD WITH GATE AND DATA LINES FORMED OF COPPER AND AN ALUMINUM UNDER-LAYER

(75) Inventor: Jin Young Kim, Incheon-si (KR)

(73) Assignee: LG Philips LCD Co., Ltd., Seoul (KR)

( * ) Notice: Subject to any disclaimer, the term of this patent is extended or adjusted under 35 U.S.C. 154(b) by 127 days.

(21) Appl. No.: 10/870,212

(22) Filed: Jun. 17, 2004

(65) Prior Publication Data

US 2005/0007511 A1    Jan. 13, 2005

(30) Foreign Application Priority Data

Jun. 26, 2003    (KR) ............... 10-2003-0042074

(51) Int. Cl.
G02F 1/1343 (2006.01)
(52) U.S. Cl. ............... 349/147; 349/148; 349/43
(58) Field of Classification Search ............... 349/43, 349/46, 147–148, 177–178
See application file for complete search history.

(56) References Cited

U.S. PATENT DOCUMENTS 5,739,877 A * 4/1998 Onisawa et al. ............... 349/42
6,587,164 B2 * 7/2003 Onisawa et al. ............... 349/43
2004/0021804 A1 * 2/2004 Hong et al. ................... 349/43
2004/0263706 A1 * 12/2004 Cho et al. ..................... 349/43
2005/0007511 A1 * 1/2005 Kim ............................. 349/43

* cited by examiner

*Primary Examiner*—Andrew Schechter
*Assistant Examiner*—Phu Vu
(74) *Attorney, Agent, or Firm*—Brinks Hofer Gilson & Lione (57) ABSTRACT

A method of fabricating a liquid crystal display device is provided. An aluminum alloy layer and a copper metal layer are sequentially formed on a substrate. A photoresist pattern is formed on the copper metal layer and the copper metal layer and the underlying aluminum alloy layer are etched to form a gate line. A gate insulating layer, an amorphous silicon layer and an impurity-doped amorphous silicon layer are deposited and then etched to form a semiconductor layer. An aluminum alloy layer and a copper metal layer are sequentially formed and etched on the structure to form a data line, a source electrode and a drain electrode. A passivation layer is formed and a contact hole and a pad opening are formed in the passivation layer. A transparent conductive thin film is deposited on this structure.

26 Claims, 14 Drawing Sheets

LCD WITH GATE AND DATA LINES FORMED OF COPPER AND AN ALUMINUM UNDER-LAYER

This application claims the benefit of the Korean Patent Application No. P2003-42074 filed in Korea on Jun. 26, 2003, which is hereby incorporated by reference.

BACKGROUND OF THE INVENTION

1. Field of the Invention

The present invention relates to a method of fabricating a liquid crystal display device and a wiring structure of the LCD, and more particularly, to a method of fabricating a liquid crystal display device and a wiring structure of the LCD in which a gate line and a data line are formed of a low resistance metal.

2. Description of the Related Art

Recently, as modern society is rapidly changing to an information-oriented society, display techniques for processing a large amount of information and displaying images are actively advancing. In particular, flat panel liquid crystal displays (LCD) have been gaining in popularity due to advantageous characteristics such as slimness, lightweight, low power consumption requirements and the like. Of these, a thin film transistor liquid crystal display device (TFT-LCD) having superior color reproduction and slimming has been developed.

Generally, the LCD uses optical anisotropy and polarization of liquid crystal for its operation. Liquid crystal molecules with a thin and long structure have directionality in their configuration. Hence, by applying an electric field to the liquid crystal molecules, it is possible to control the alignment direction of the liquid crystal molecules.

To this end, by arbitrarily controlling the alignment direction of the liquid crystal molecules, the alignment of the liquid crystal molecules is varied and a polarized light is modulated by the optical anisotropy of the liquid crystal, thereby displaying image information.

Recently, an active matrix LCD (AM-LCD) in which the aforementioned thin film transistors and pixel electrodes connected to the thin film transistors are arranged in a matrix configuration is gaining popularity due to its high resolution and superior moving picture reproducing capability.

Figure 1:
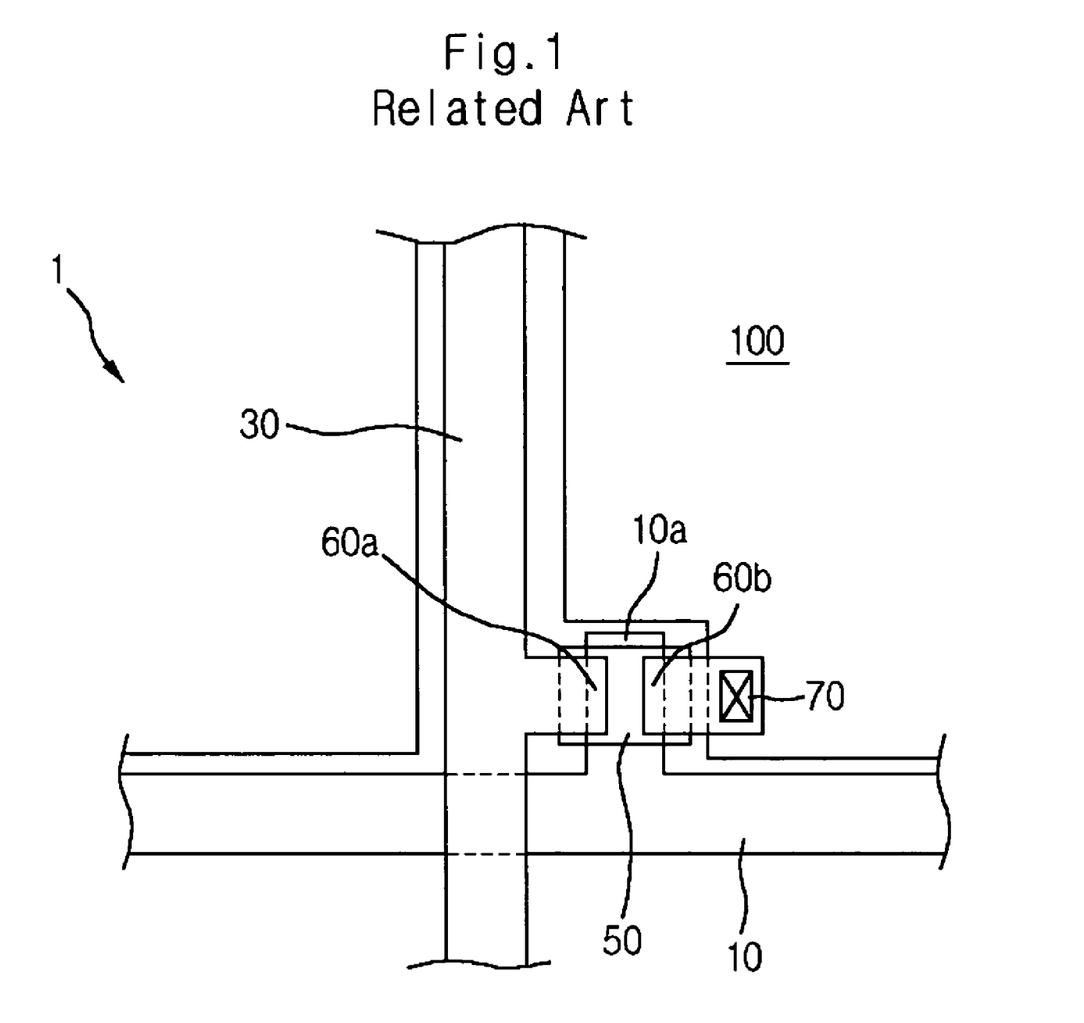
FIG. 1 is a plane view illustrating a pixel structure of a related art LCD.

FIG. 1 is a plane view illustrating a pixel structure of a related art LCD.

Referring to FIG. 1, a plurality of gate lines 10 for applying a driving signal are arranged on a thin film transistor substrate 1 of an LCD. A plurality of data lines 30 are arranged on the thin film transistor substrate and cross the gate lines perpendicularly. A plurality of pixel regions are defined by the gate lines 10 and the data lines 30.

In a unit pixel region defined by the pair of gate lines 10 and the pair of data lines 30, a thin film transistor (TFT) serving as a switching element is arranged.

The TFT has a structure in which a gate insulating layer, a semiconductor layer 50 consisting of an amorphous silicon (a-Si) layer and an impurity-doped amorphous silicon (n+ a-Si) layer, a source electrode 60a and a drain electrode 60b are formed on a gate electrode 10a branched from the gate line 10.

The drain electrode 60b of the TFT is electrically connected with a pixel electrode 100 through a contact hole 70 within the unit pixel region defined by the gate line 10 and the data line 30.

Recently, as the resolution and screen sizes of the LCD have increased, the use of a metal with decreased resistance as the gate line and the data line has become more desirable. To enable use of the resistance metal, methods of fabricating the LCD using such a metal are being developed.

Figure 2A:
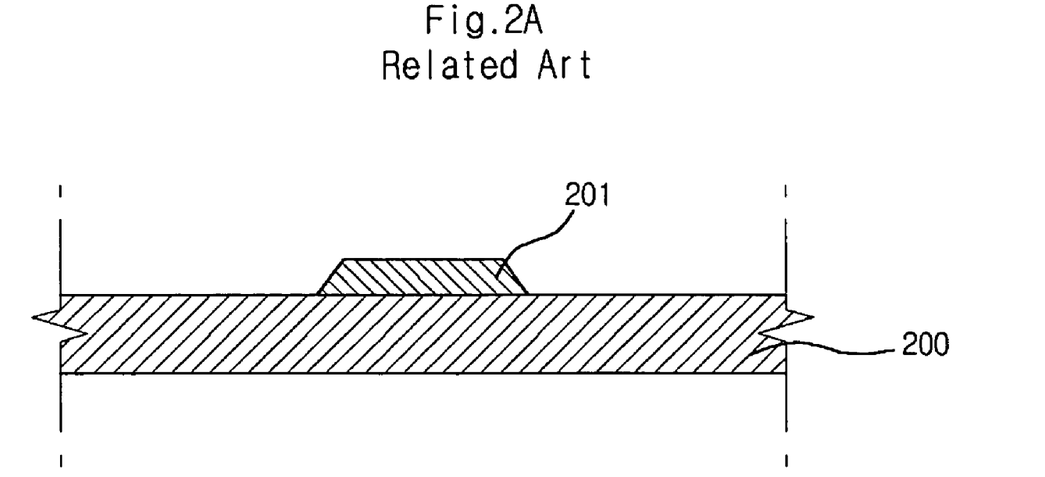
FIGS. 2A and 2B are sectional views illustrating a stack structure of a gate electrode in a fabrication method of an LCD according to a related art.
Figure 2B:
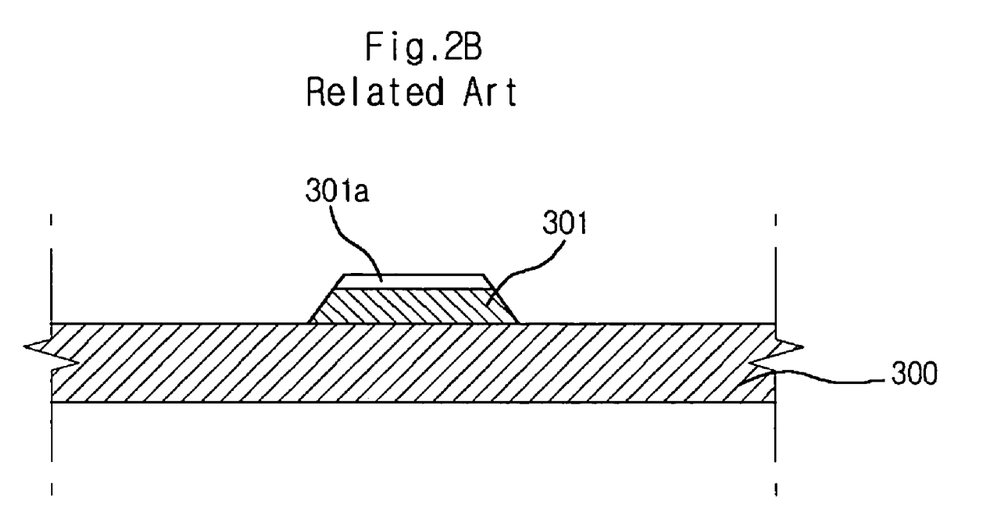

FIGS. 2A and 2B are sectional views illustrating a stack structure of a gate electrode in a fabrication method of an LCD according to a related art. Specifically, FIG. 2A shows a metal line on a substrate is formed of a single metal layer such as molybdenum (Mo) or chromium (Cr). The metal line formed of Mo or Cr is able to be chemically etched in a simple manner.

The process of forming the gate line is performed like in the process of forming the gate line of a general LCD. In other words, a metal layer of Mo or Cr is deposited on a cleaned substrate 200. A photoresist film is coated on the metal layer, and is exposed and developed using a mask, thereby forming a photoresist pattern. The metal film is etched by using the photoresist pattern as an etch mask, thereby forming a gate line and a gate electrode 201 at the same time.

FIG. 2B shows a gate line has a double layered structure consisting of an Mo metal layer and an Al alloy layer. Referring to FIG. 2B, an Al alloy layer 301 is deposited on a substrate 300, and then an Mo metal layer 301a is deposited on the Al alloy layer 301.

Since the Al alloy layer 301 has superior adhesion to the substrate and low resistance characteristics compared with the Mo metal layer 301a, the double layered structure is superior in resistance characteristic to the single layer structure of Mo or Cr shown in FIG. 2A.

The Mo metal layer 301a continuously deposited on the Al alloy layer 301 prevents an aluminum oxide ($Al_2O_3$) layer from being formed on the Al alloy layer 301, thereby decreasing a contact resistance between gate pad and pixel electrode to be formed later.

Also, the Mo metal layer 301a prevents the Al alloy layer 301 from being damaged while a photolithography process of the semiconductor layer and the metal layer is performed.

Figure 3A:
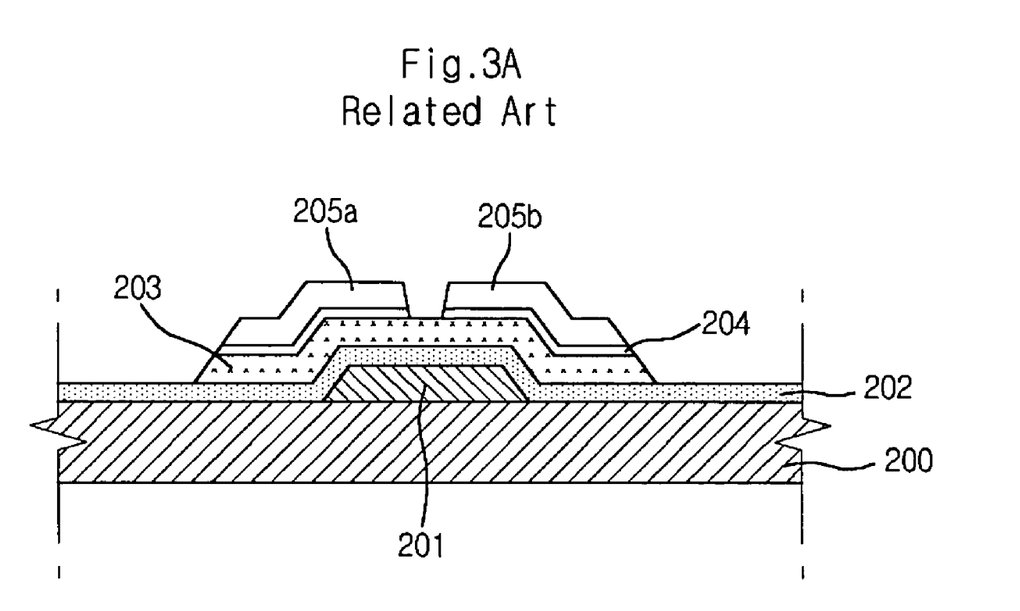
FIGS. 3A and 3B are sectional views illustrating a fabrication method of an LCD, and structures of source and drain electrodes the array substrate according to a related art.
Figure 3B:
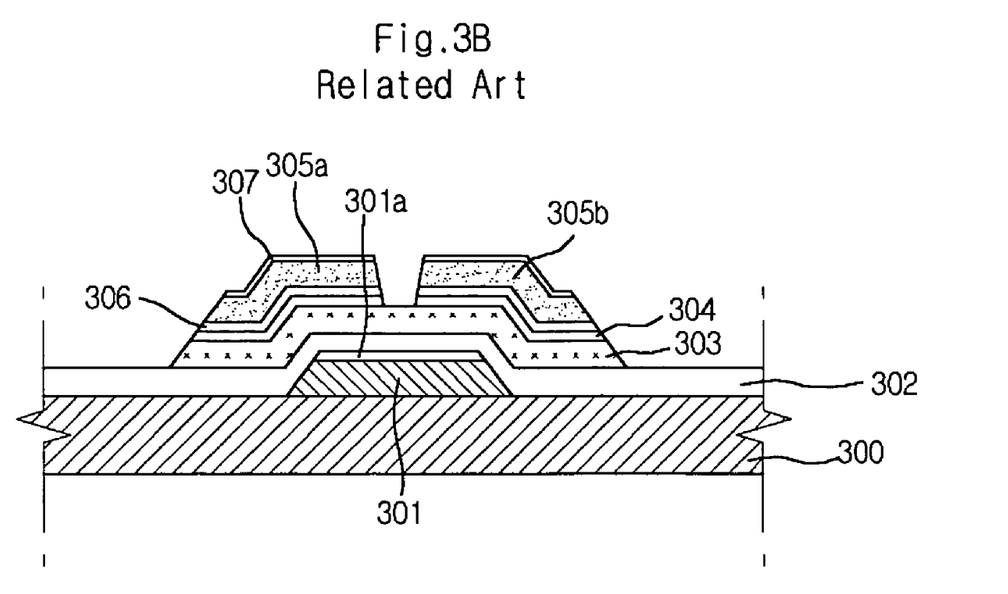

FIGS. 3A and 3B are sectional views illustrating a fabrication method of an LCD, and structures of source and drain electrodes the array substrate according to a related art. Specifically, FIG. 3A shows that a source electrode 205a and a drain electrode 205b are formed above the gate electrode 201 shown in FIG. 2A, thereby forming a TFT.

The fabrication method of the TFT will now be described in more detail.

A gate insulating layer 202 is formed on the gate electrode 201 formed of a single metal layer and a transparent substrate 200. Thereafter, a semiconductor layer 203, 204 is formed on a resultant structure of the transparent substrate 200 by depositing an amorphous silicon (a-Si) layer 203 and an impurity-doped amorphous silicon (n+ a-Si) layer 204.

Next, a single metal layer of Mo or Cr is deposited on the semiconductor layer 204 and is then etched, thereby forming a source electrode 205a and a drain electrode 205b. By the above processes, a thin film transistor having electrodes made of the aforementioned signal metal layer can be formed.

Unlike in the above, FIG. 3B shows that a source electrode and a drain electrode are formed above the gate electrode shown in FIG. 2B. That is, FIG. 3B shows that each of the electrodes of a TFT is formed in a double layered structure consisting of an Mo metal layer and an Al alloy layer.

The fabrication method of the TFT will now be described in more detail.

A gate insulating layer 302 and a semiconductor layer 303, 304 are sequentially formed on a substrate 300 and a gate electrode 301, 301a having a double layered structure consisting of an Mo metal layer 301a and an Al alloy layer 301. Next, an Mo metal layer 306, 307 and an Al alloy layer are sequentially formed on the semiconductor layer 303, 304 and are then etched, thereby forming a source electrode 305a and a drain electrode 305b, each having a triple layered structure consisting of the Mo metal layer 306, 307 and the Al alloy layer.

In the above method, the Mo metal layer 301a, 306, 307 may replaced by a Cr metal layer.

The Al alloy is generally used as a material of the gate line, and has a relatively low resistance, thereby enabling a rapid signal transmission.

The Mo (or Cr) metal layer formed on the source electrode 305a and the drain electrode 305b prevents an aluminum oxide ($Al_2O_3$) layer from being formed on the Al alloy layer 307, thereby decreasing a contact resistance between the source/drain electrode and the pixel electrode connected to a data pad later.

Also, the Mo (or Cr) metal layer functions as a buffer layer for preventing the Al alloy layer 301 from being damaged while a photolithography process of the semiconductor layer and the metal layer is performed.

However, since the single Mo or Cr layer, and the double layers of the Mo or Cr layer and the Al alloy layer are have a high resistance, it is difficult to use them in an LCD with a high resolution of greater than UXGA (1600×1200) level.

Thus, if the resistance of the electrodes or signal lines is not sufficiently low, a signal transmission delay and a signal transmission loss may be caused.

SUMMARY OF THE INVENTION

A method of fabricating a liquid crystal display device and a wiring structure of the LCD are presented that employ a low resistance wiring structure and permit high resolution and large-sized screen to be fabricated.

A liquid crystal display device and fabrication method are presented that can minimize loss of the semiconductor layer by reducing a height difference in a stepped portion of the semiconductor layer.

As embodied and broadly described herein, there is provided a method of fabricating a liquid crystal display device is provided. The method includes: sequentially forming an aluminum alloy layer and a copper metal layer on a substrate; forming a photoresist pattern on the copper metal layer and etching the copper metal layer and the underlying aluminum alloy layer to form a gate line; depositing and etching a gate insulating layer, an amorphous silicon layer and an impurity-doped amorphous silicon layer to form a semiconductor layer; sequentially forming and etching an aluminum alloy layer and a copper metal layer on a resultant structure of the substrate including the semiconductor layer to form a data line, a source electrode and a drain electrode; forming a passivation layer on a resultant structure of the substrate including the data line, the source electrode and the drain electrode, and forming a contact hole and a pad opening in the passivation layer; and depositing a transparent conductive thin film on a resultant structure of the substrate including the passivation layer having the contact hole and the pad opening.

According to another aspect of the present invention, there is provided a wiring structure of an LCD including a gate line, a data line, and a thin film transistor, the thin film transistor having a gate electrode, a source electrode and a drain electrode, wherein each of the gate line, the data line, the gate electrode, the source electrode, and the drain electrode is formed in a double layers of an aluminum alloy layer and a copper metal layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 4:
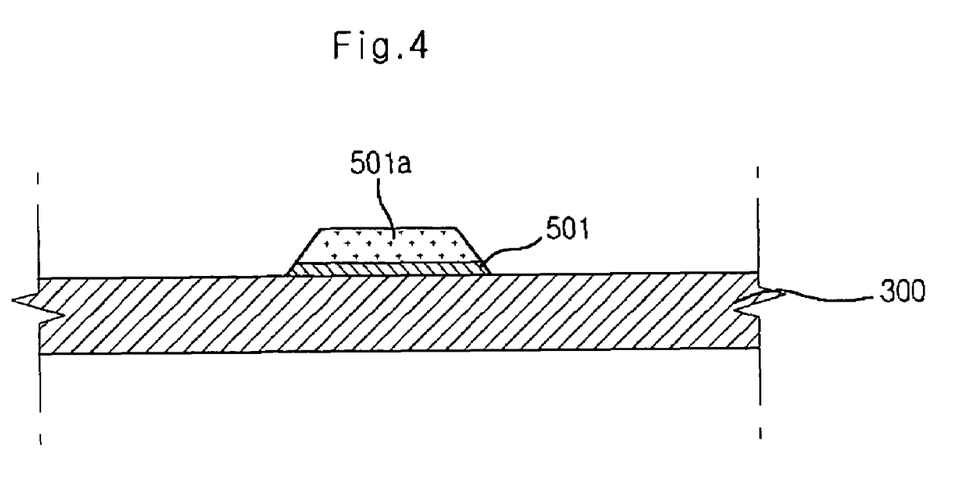
FIG. 4 is a sectional view illustrating a structure of a gate line in an LCD according to the present invention.

FIG. 4 is a sectional view illustrating a structure of a gate line in an LCD according to an embodiment of the present invention.

Referring to FIG. 4, an inventive LCD includes a gate line having a double layered structure consisting of a copper metal layer 501a and an aluminum alloy layer 501.

To form the gate line, an aluminum alloy layer 501 is deposited on a transparent substrate 300 and a copper metal layer 501a is deposited on the aluminum alloy layer 501 in an identical chamber. Alternatively, the aluminum alloy layer 501 is first deposited, is exposed to air, and then the copper metal layer 501a is deposited in a copper film deposition chamber.

The aluminum alloy layer 501 is formed thinner than the copper metal layer 501a because the resistance of the double gate line is dependent on the thickness of the copper metal layer 501a and the thickness of the aluminum alloy layer 501. Detailed description relating to the resistance will be described later with reference to FIGS. 8 and 9.

Thus, since the gate line is formed of the double layered structure of the copper metal layer 501a and the aluminum alloy layer 501, the gate line can be employed to create a high resolution LCD having low resistance line characteristics.

Figure 5:
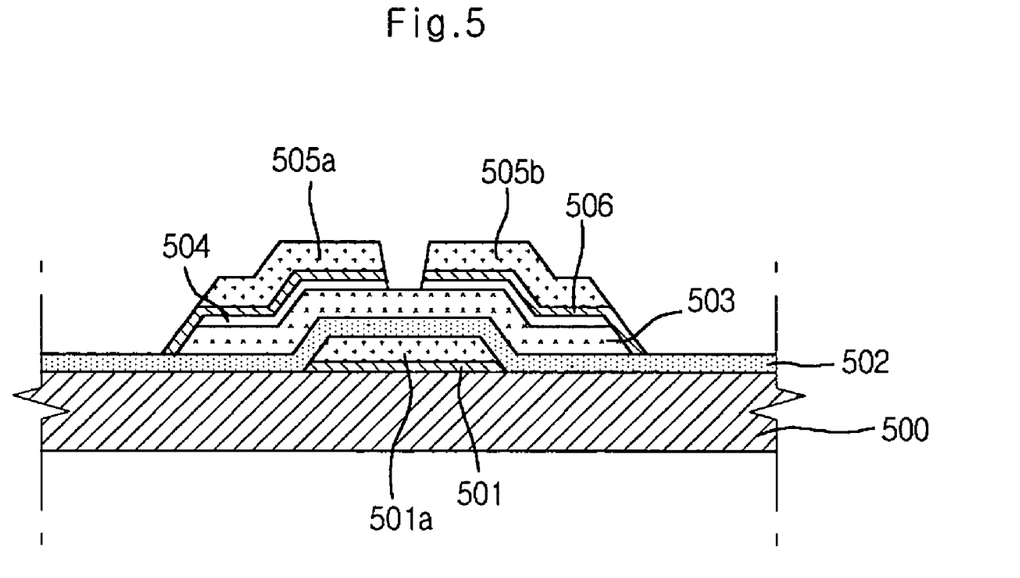
FIG. 5 is a sectional view illustrating a fabrication method of an LCD and a source/drain structure of the LCD according to the present invention.

FIG. 5 is a sectional view illustrating a fabrication method of an LCD and a source/drain structure of the LCD according to an embodiment of the present invention.

Referring to FIG. 5, a gate electrode of a thin film transistor of an LCD has a double layered structure consisting of an aluminum alloy layer 501 and a copper metal layer 501a. A gate insulating layer 502 is formed on the gate electrode and a transparent substrate 500. Thereafter, a semiconductor layer 503, 504, a source electrode 505a and a drain electrode 505b each including an aluminum alloy layer 506 are formed on a resultant structure of the transparent substrate 500.

In the forming of the source and drain electrode layers 505a and 505b as the double layered structure including the aluminum alloy layer 506, the aluminum alloy layer 506 and the copper metal layer 505a, 505b are formed by a continuous deposition or a non-continuous deposition. At this time, to allow the double layers to have a low resistance, the source and drain electrode layer 505a, 505b made of copper metal is formed thicker than the aluminum alloy layer 506.

The semiconductor layer 503, 504 includes an unintentionally doped amorphous silicon (a-Si) layer 503 and an impurity-doped amorphous silicon (n+ a-Si), which are formed on the gate insulating layer 502.

Figure 6A:
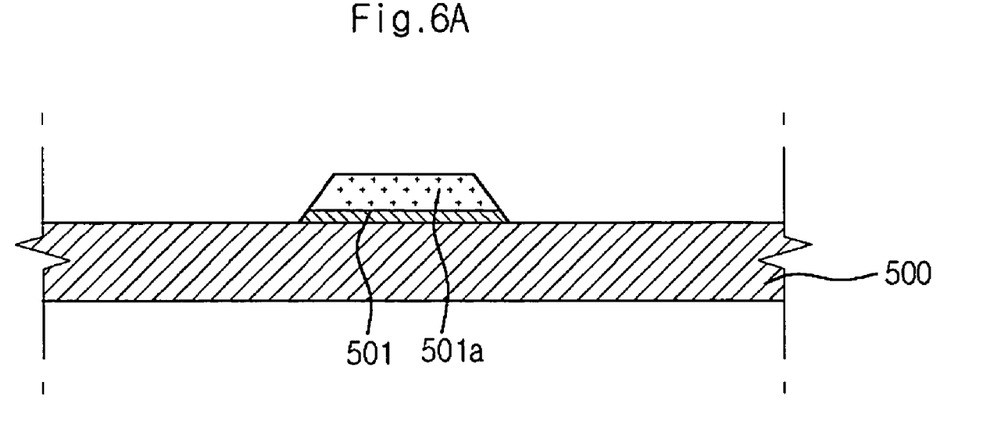
FIGS. 6A through 6C are sectional views illustrating a fabrication method of an LCD according to the present invention.
Figure 6B:
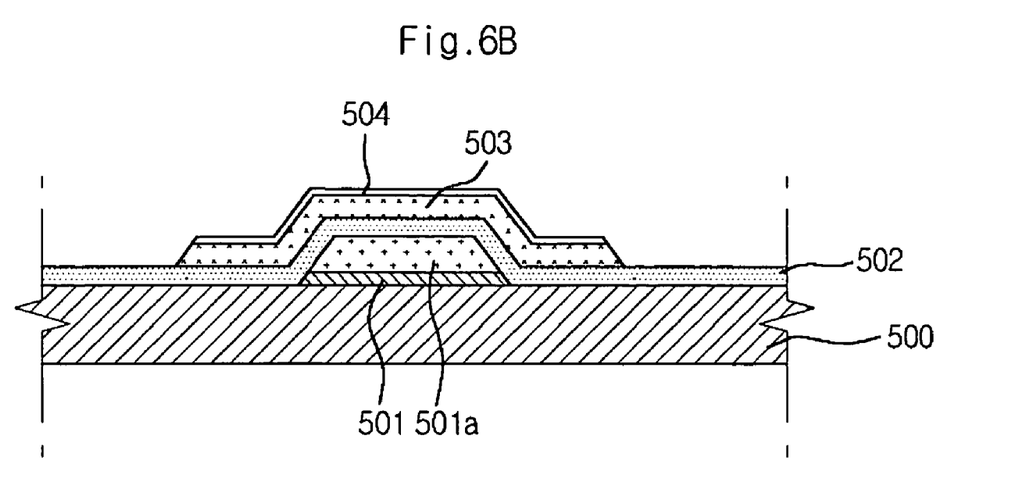
Figure 6C:
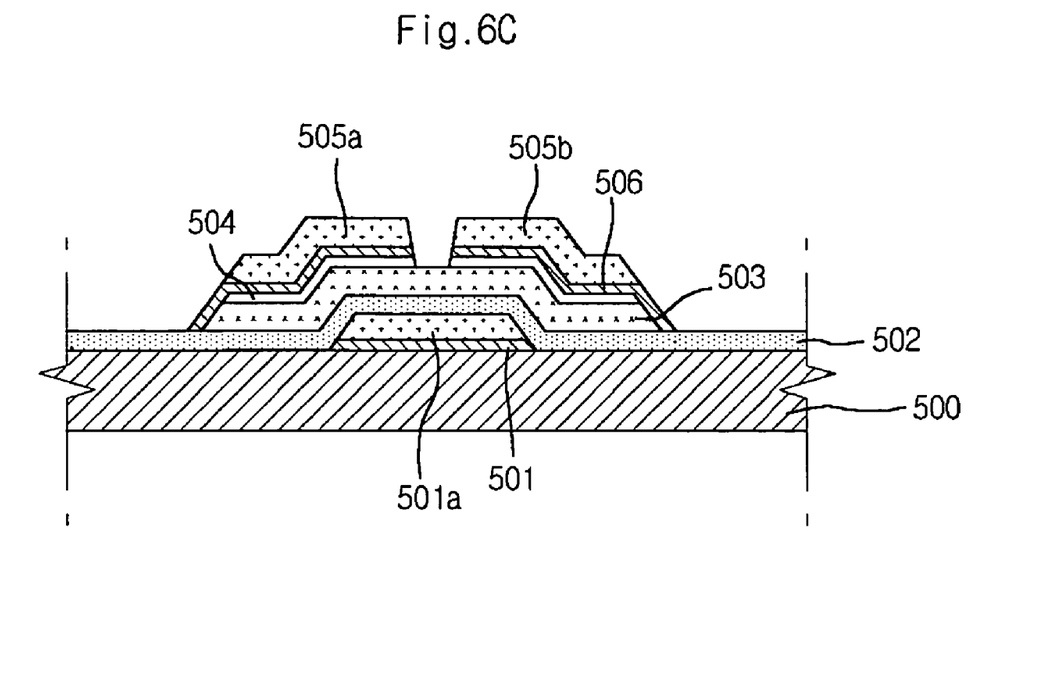

Next, a fabrication method of an LCD according to the present invention will now be described with reference to FIGS. 6A through 6C. FIGS. 6A through 6C are sectional views illustrating a fabrication method of an LCD according to an embodiment of the present invention.

First, referring to FIG. 6A, an aluminum alloy layer 501 is deposited on a transparent substrate 500 and then a copper metal layer 501a is deposited on the aluminum alloy layer 501. At this time, the copper metal layer 501a and the aluminum alloy layer 501 can be continuously deposited in an identical chamber. Alternatively, the aluminum alloy layer 501 and the copper metal layer 501a can be deposited in a non-continuous deposition method. In other words, the aluminum alloy layer 501 is first deposited, is exposed to air, and then the copper metal layer 501a is deposited inside the chamber where the copper metal layer deposition has been deposited.

The aluminum alloy layer 501 includes an aluminum layer, or an aluminum alloy layer containing a conductive metal element. The conductive metal element can be alloyed with aluminum.

Next, a photoresist film is coated on an entire surface of a resultant structure of the substrate 500, and is then patterned by a photolithography process including exposing, developing and etching, thereby forming a gate line 501, 501a.

Since the double layers of the copper layer 501a and the aluminum layer 501 are used as the gate line, an etchant used for patterning the gate line may be different, but other elements except for the etchant are the same as those of the related art fabrication method of the LCD.

Next, referring to FIG. 6B, after the gate pattern including the gate line and the gate electrode is formed, a gate insulating layer 502, an unintentionally doped amorphous silicon (a-Si) layer 503, an impurity-doped amorphous silicon (n+ a-Si) layer 504 are sequentially deposited on a resultant structure of the substrate 500 including the gate pattern, and are patterned to form a semiconductor layer including an unintentionally doped amorphous silicon (a-Si) layer pattern 503 and an impurity-doped amorphous silicon (n+ a-Si) layer pattern 504.

Next, referring to FIG. 6C, after the semiconductor layer is formed, double layers consisting of an aluminum layer 506 and a copper metal layer are deposited by a continuous deposition or a non-continuous deposition like in the deposition of the gate pattern.

The deposited double layers are patterned by a photolithography process including an exposing operation and an etching operation, thereby forming a source electrode 505a and a drain electrode 505b.

Thereafter, although not shown in the drawings, a passivation layer is formed on a resultant structure of the substrate including the source electrode 505a and the drain electrode 505b, and contact holes exposing the drain electrode 505b and the source electrode 505a are formed in the passivation layer. Then, an ITO thin film is deposited on a resultant structure of the substrate including the passivation layer, and is then patterned to form a pixel electrode, thereby completing a thin film transistor of an LCD.

As described above, since the gate line, the gate electrode, the data line, the source electrode and the data electrode are all formed in double layers of aluminum layer and copper layer, the LCD has an effective low resistance wiring.

Next, when the double layers of aluminum layer and copper layer are formed in an identical chamber by continuous deposition, and when the double layers of aluminum layer and copper layer are formed by the non-continuous deposition method including depositing the aluminum layer, exposing the deposited aluminum layer to air, and then depositing the copper layer, variation in resistance will now be described.

Figure 7A:
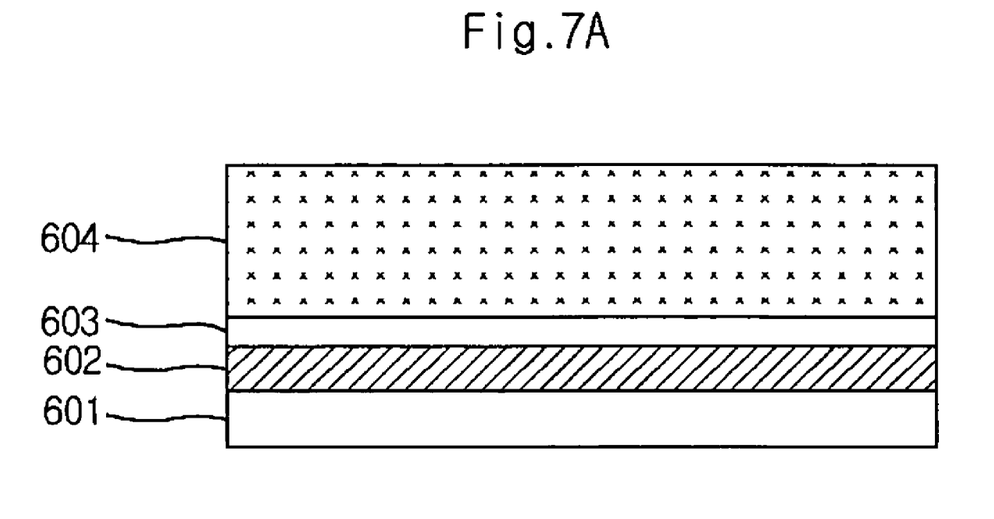
FIG. 7A is a schematic view illustrating a sectional structure of electrodes of an LCD formed by a continuous deposition.

FIG. 7A is a schematic view illustrating a sectional structure of electrodes of an LCD formed by a continuous deposition.

Referring to FIG. 7A, an aluminum alloy layer 602 is deposited on a substrate 601 at a thickness of 200 Å. The deposited aluminum alloy layer 602 is exposed to air, and then a copper metal layer 604 is deposited thereon. An aluminum oxide layer 603 having a chemical formula of $Al_2O_3$ is formed between the aluminum alloy layer 602 and the copper metal layer 604.

The aluminum oxide layer 603 has a thickness of a few Å. The non-continuous deposition method can maintain a low resistance without any variation in the total resistance, but has relatively low production yield due to processes being non-continuous.

Figure 7B:
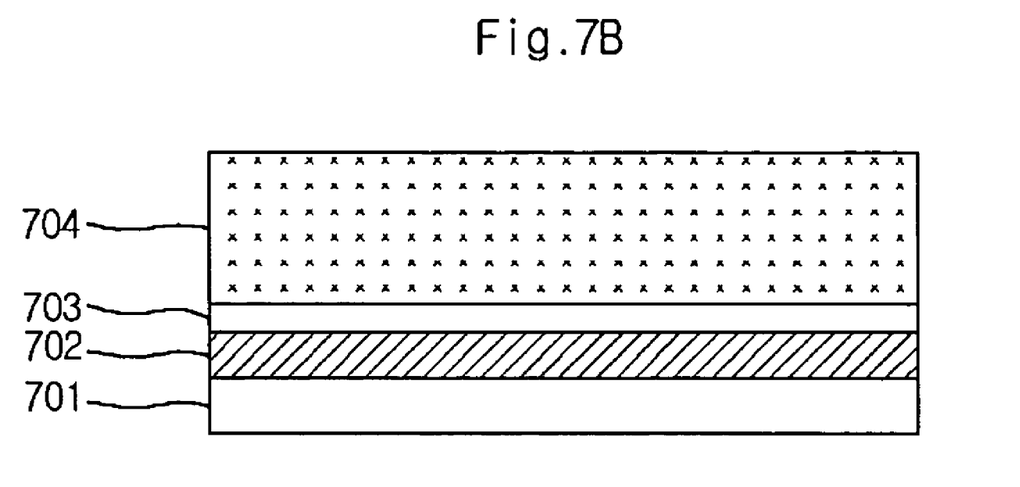
FIG. 7B is a schematic view illustrating a sectional structure of electrodes of an LCD formed by a non-continuous deposition.

FIG. 7B is a schematic view illustrating a sectional structure of electrodes of an LCD formed by a non-continuous deposition.

Unlike in FIG. 7A, FIG. 7B corresponds to continuously deposition of an aluminum alloy layer 702 and a copper metal layer 704 without an exposure of the aluminum alloy layer 702. Since the aluminum alloy layer 702 is not exposed to air, the aluminum oxide layer is not formed, but a CuAl layer 703 is formed at a thickness of a few of tens Å due to a chemical reaction between the copper metal layer 704 and the aluminum alloy layer 702.

Thus, if the aluminum alloy layer 702 and the copper metal layer 704 are deposited by the non-continuous deposition, resistivity increases due to thermal treatment and accordingly resistance may increase.

However, if the aluminum alloy layer 702 and the copper metal layer 704 are deposited by the continuous deposition without a stop in the processes, production efficiency increases.

Figure 8:
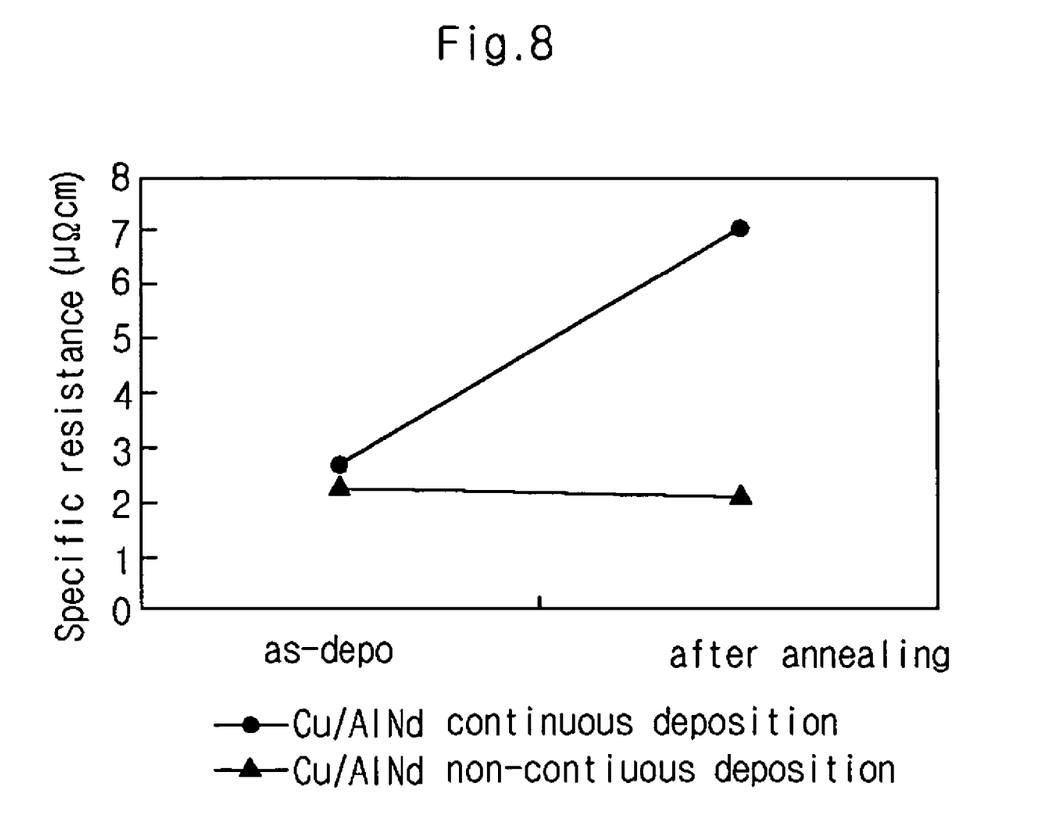
FIG. 8 is a graph illustrating variation in specific resistance when thermally annealing the electrodes fabricated as in FIGS. 7A and 7B.
Figure 9:
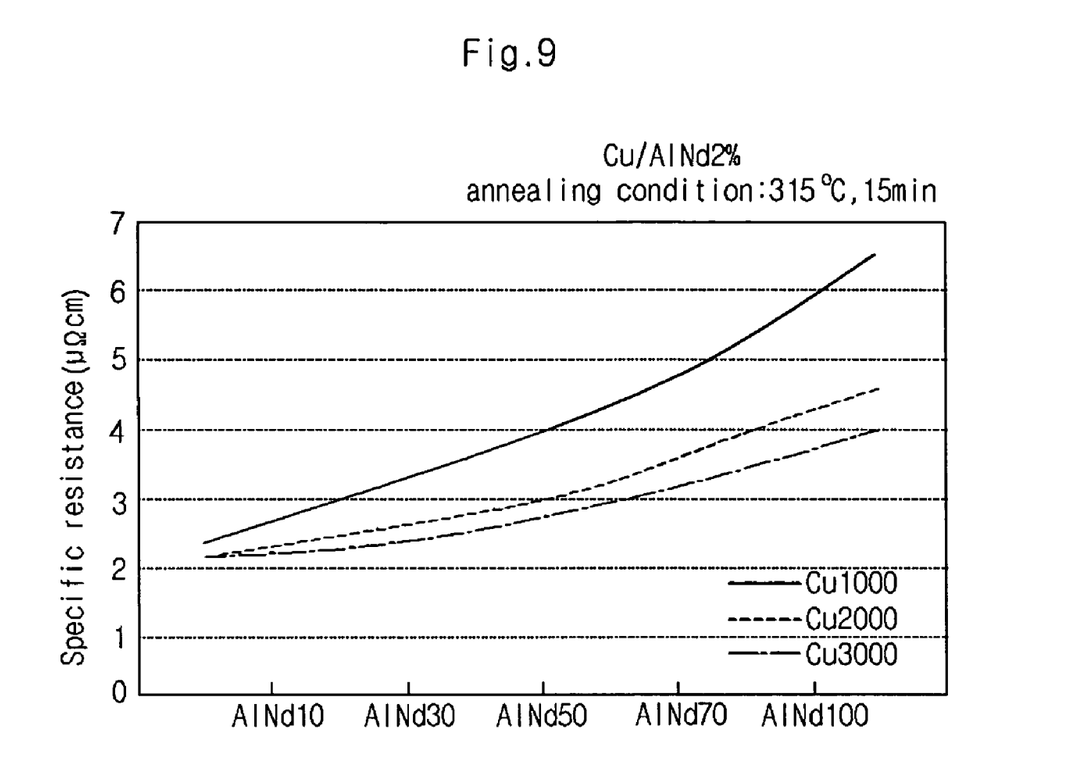
FIG. 9 is a graph illustrating variation in specific resistance with respect to the thickness of the electrodes fabricated as in FIGS. 7A and 7B.

FIG. 8 is a graph illustrating variation in specific resistance when thermally annealing the electrodes fabricated as in FIGS. 7A and 7B, and FIG. 9 is a graph illustrating variation in specific resistance with respect to the thickness of the electrodes fabricated as in FIGS. 7A and 7B.

Referring to FIG. 8, if the aluminum alloy layer 602 is deposited on a substrate 601, exposed to air, and then the copper metal layer 604 deposited thereon, as shown in FIG. 7A, the specific resistance does not vary appreciably and is essentially constant even after thermal annealing is performed. In other words, the low resistance of the copper layer is essentially maintained at a constant value.

However, if the aluminum alloy layer 702 and the copper metal layer 704 are continuously deposited in the same chamber as shown in FIG. 7B, specific resistance of the double layered electrode increases and accordingly the double layered electrode fails to maintain a low resistance.

When considering the above facts, it is noted that the fabrication method presented herein can employ both the continuous deposition and the non-continuous deposition. However, if the lowest resistance is desired for a high resolution LCD, it is more desirable to use the continuous deposition process.

Referring to FIG. 9, the resistance of the double layered electrode increases as the thickness of the aluminum alloy layer increases, or as the thickness of the copper metal layer decreases.

Accordingly, when forming the wiring structure with a double layered electrode consisting of the aluminum alloy layer and the copper metal layer, the copper metal layer is made thick and the aluminum alloy layer is made thin.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a liquid crystal display device, the method comprising:
    sequentially forming a first aluminum alloy layer and a first copper metal layer on a substrate;
    forming a photoresist pattern on the first copper metal layer and etching the first copper metal layer and the underlying first aluminum alloy layer to form a gate line;
    depositing and etching a gate insulating layer, an amorphous silicon layer and an impurity-doped amorphous silicon layer to form a semiconductor layer;
    sequentially forming and etching a second aluminum alloy layer and a second copper metal layer on the substrate to form a data line, a source electrode and a drain electrode;
    forming a passivation layer on the substrate including the data line, the source electrode and the drain electrode, and forming a contact hole and a pad opening in the passivation layer; and
    depositing a transparent conductive thin film on the substrate including the passivation layer having the contact hole and the pad opening.

2. The method according to claim 1, wherein one or more of the first and second aluminum alloy layer is formed of aluminum or an aluminum alloy containing aluminum and a conductive metal element.

3. The method according to claim 1, wherein one or more of: a) the first aluminum alloy layer and the first copper metal layer or b) the second aluminum alloy layer and the second copper metal layer, are deposited in the same chamber in a continuous deposition.

4. The method according to claim 1, wherein one or more of: a) the first aluminum alloy layer and the first copper metal layer or b) the second aluminum alloy layer and the second copper metal layer, are deposited by a non-continuous deposition that includes depositing the first or second aluminum alloy layer, exposing the deposited first or second aluminum alloy layer to air, and depositing the first or second copper metal layer.

5. The method according to claim 1, wherein one or more of: the first copper metal layer is thicker than the first aluminum alloy layer or the second copper metal layer is thicker than the second aluminum alloy layer.

6. The method according to claim 5, further comprising limiting the thickness of one or more of the first or second aluminum alloy layers to be no thicker than about 200 Å.

7. The method according to claim 1, further comprising permitting an $Al_2O_3$ layer of at most about a few Å to be formed between one or more of the first or second aluminum alloy layers and the corresponding first or second copper metal layer.

8. The method according to claim 1, further comprising permitting a CuAl layer of at most about a few tens of Å to be formed between one or more of the first or second aluminum alloy layers and the corresponding first or second copper metal layer.

9. The method according to claim 1, further comprising forming the passivation layer adjacent to the second copper layer.

10. The method according to claim 1, further comprising limiting the number of metal layers such that one or more of: a) the first aluminum alloy layer and the first copper metal layer are the only metal layers to form the gate line or b) the second aluminum alloy layer and the second copper metal layer are the only metal layers to form the data line and source and drain electrodes.

11. A wiring structure of an LCD comprising:
    a gate line formed of a first layered structure containing a first aluminum alloy layer and a first copper metal layer;
    a data line formed of a second layered structure containing a second aluminum alloy layer and a second copper metal layer; and
    a thin film transistor having a gate electrode, a source electrode and a drain electrode,
    wherein the gate electrode, the source electrode, and the drain electrode are each formed of a third layered structure containing a third aluminum alloy layer and a third copper metal layer.

12. The wiring structure according to claim 11, wherein one or more of the first, second, and third aluminum alloy layers is formed of aluminum or an aluminum alloy containing aluminum and a conductive metal element.

13. The wiring structure according to claim 11, wherein one or more of: the first copper metal layer is thicker than the first aluminum alloy layer, the second copper metal layer is thicker than the second aluminum alloy layer, or the third copper metal layer is thicker than the third aluminum alloy layer.

14. The wiring structure according to claim 13, wherein the thickness of one or more of the first, second, and third aluminum alloy layers is no thicker than about 200 Å.

15. The wiring structure according to claim 11, wherein an Al2O3 layer of at most about a few Å is formed between one or more of the first, second, and third aluminum alloy layers and the corresponding first, second, and third copper metal layer.

16. The wiring structure according to claim 11, wherein a CuAl layer of at most about a few tens of Å is formed between one or more of the first, second, and third aluminum alloy layers and the corresponding first, second, and third copper metal layer.

17. The wiring structure according to claim 11, wherein one or more of: a) the first aluminum alloy layer and the first copper metal layer are the only metal layers to form the gate line, b) the second aluminum alloy layer and the second copper metal layer are the only metal layers to form the data line, or c) the third aluminum alloy layer and the third copper metal layer are the only metal layers to form the gate, source and drain electrodes.

18. A liquid crystal display device, which is fabricated by a method comprising:
sequentially forming a first aluminum alloy layer and a first copper metal layer on a substrate;
forming a photoresist pattern on the first copper metal layer and etching the first copper metal layer and the underlying first aluminum alloy layer to form a gate line;
depositing and etching a gate insulating layer, an amorphous silicon layer and an impurity-doped amorphous silicon layer to form a semiconductor layer;
sequentially forming and etching a second aluminum alloy layer and a second copper metal layer to form a data line, a source electrode and a drain electrode;
forming a passivation layer on the substrate including the data line, the source electrode and the drain electrode, and forming a contact hole and a pad opening in the passivation layer; and
depositing a transparent conductive thin film on the substrate including the passivation layer having the contact hole and the pad opening.

19. The liquid crystal display device according to claim 18, wherein one or more of the first and second aluminum alloy layers is formed of aluminum or an aluminum alloy containing aluminum and a conductive metal element.

20. The liquid crystal display device according to claim 18, wherein one or more of: a) the first aluminum alloy layer and the first copper metal layer or b) the second aluminum alloy layer and the second copper metal layer, are deposited in the same chamber by a continuous deposition.

21. The liquid crystal display device according to claim 18, wherein one or more of: a) the first aluminum alloy layer and the first copper metal layer or b) the second aluminum alloy layer and the second copper metal layer, are deposited by a non-continuous deposition including depositing the first or second aluminum alloy layer, exposing the deposited first or second aluminum alloy layer to air, and depositing the first or second copper metal layer.

22. The liquid crystal display device according to claim 18, wherein one or more of: the first copper metal layer is thicker than the first aluminum alloy layer or the second copper metal layer is thicker than the second aluminum alloy layer.

23. The liquid crystal display device according to claim 22, wherein the thickness of one or more of the first and second aluminum alloy layers is no thicker than about 200 Å.

24. The liquid crystal display device according to claim 18, wherein an $Al_2O_3$ layer of at most about a few Å is formed between one or more of the first and second aluminum alloy layers and the corresponding first and second copper metal layer.

25. The liquid crystal display device according to claim 18, wherein a CuAl layer of at most about a few tens of Å is formed between one or more of the first and second aluminum alloy layers and the corresponding first and second copper metal layer.

26. The liquid crystal display device according to claim 18, wherein one or more of: a) the first aluminum alloy layer and the first copper metal layer are the only metal layers to form the gate line or b) the second aluminum alloy layer and the second copper metal layer are the only metal layers to form the data line and the source and drain electrodes.

* * * * *